(12) United States Patent
Chen

(10) Patent No.: US 10,777,690 B2
(45) Date of Patent: Sep. 15, 2020

(54) CAPACITOR STRUCTURE HAVING VERTICAL DIFFUSION PLATES

(71) Applicant: Yangtze Memory Technologies Co., Ltd., Wuhan, Hubei Province (CN)

(72) Inventor: Liang Chen, Wuhan (CN)

(73) Assignee: Yangtze Memory Technologies Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/296,086

(22) Filed: Mar. 7, 2019

(65) Prior Publication Data

US 2020/0243693 A1    Jul. 30, 2020

Related U.S. Application Data

(63) Continuation of application No. PCT/CN2019/073896, filed on Jan. 30, 2019.

(51) Int. Cl.

| H01L 27/108 | (2006.01) |
|---|---|
| H01L 29/94 | (2006.01) |
| H01L 49/02 | (2006.01) |
| H01L 29/06 | (2006.01) |
| H01L 29/16 | (2006.01) |

(52) U.S. Cl.
CPC ............ *H01L 29/94* (2013.01); *H01L 28/20* (2013.01); *H01L 28/60* (2013.01); *H01L 29/0649* (2013.01); *H01L 29/16* (2013.01)

(58) Field of Classification Search
CPC ........ H01L 29/94; H01L 29/945; H01L 23/64
See application file for complete search history.

(56) References Cited

U.S. PATENT DOCUMENTS

| 7,682,922 B2 | 3/2010 | Chinthakindi |
| 9,893,163 B2 | 2/2018 | Liu |
| 10,134,830 B2 | 11/2018 | Hu |
| 2007/0018274 A1 | 1/2007 | Bonart |
| 2012/0286392 A1* | 11/2012 | Pei .................... H01L 27/10897 257/532 |
| 2015/0263083 A1 | 9/2015 | Popp |
| 2018/0076277 A1 | 3/2018 | Hu |
| 2018/0301191 A1 | 10/2018 | Widjaja |

FOREIGN PATENT DOCUMENTS

| CN | 101064282 A | 10/2007 |
| CN | 101226898 A | 7/2008 |
| CN | 102760737 A | 10/2012 |

(Continued)

*Primary Examiner* — Samuel A Gebremariam
(74) *Attorney, Agent, or Firm* — Winston Hsu

(57) ABSTRACT

A capacitor structure includes a semiconductor substrate, a first vertical diffusion plate disposed in the semiconductor substrate, a first shallow trench isolation (STI) structure disposed in the semiconductor substrate and surrounding the first vertical diffusion plate, and a second vertical diffusion plate disposed in the semiconductor substrate and surrounding the first STI structure. The first vertical diffusion plate further includes a first lower portion that is part of the semiconductor substrate. The first lower portion is surrounded and electrically isolated by a first wafer-backside trench isolation structure. The first wafer-backside trench isolation structure is in direct contact with a bottom of the first STI structure.

23 Claims, 5 Drawing Sheets

(56) References Cited

FOREIGN PATENT DOCUMENTS

| | | |
|---|---|---|
| CN | 103094362 A | 5/2013 |
| CN | 107818970 A | 3/2018 |
| TW | 200605328 | 2/2006 |
| TW | I292609 | 1/2008 |
| TW | I415226 | 11/2013 |
| TW | 201349513 A | 12/2013 |
| TW | 201839823 A | 11/2018 |
| WO | 2018/182724 A1 | 10/2018 |

* cited by examiner

CAPACITOR STRUCTURE HAVING VERTICAL DIFFUSION PLATES

CROSS REFERENCE TO RELATED APPLICATIONS

This application is a continuation of PCT Application No. PCT/CN2019/073896 filed on Jan. 30, 2019, the entire contents of which are incorporated herein by reference.

BACKGROUND OF THE INVENTION

1. Field of the Invention

The present disclosure generally relates to the field of semiconductor technology and, more particularly, to a capacitor structure having vertically-arranged diffusion plates in a silicon substrate.

2. Description of the Prior Art

As known in the art, 3D NAND is a flash memory technology which stacks memory cells vertically to increase capacity for higher storage density and lower cost per gigabyte.

In 3D NAND technology, memory cells are operated at high voltages, and capacitors are required to implement voltage boosting. Typically, MOS capacitors, MOM capacitors, or poly-to-poly capacitors are used in 3D NAND chip circuits.

As 3D NAND technology is moving toward high density and high capacity, especially from 64-layer to 128-layer scheme, the number of devices and the number of traces have increased significantly, while the area of chip has remained essentially unchanged. As a result, the space for silicon wafer and back-end routing is getting smaller and smaller. Conventional MOS capacitors or MOM capacitors usually require a large chip area or metal trace area in the back-end stage, and the large-area MOS capacitor may cause time-dependent dielectric breakdown (TDDB) problems.

Therefore, there is still a need in the art for a novel capacitor structure to meet the circuit requirements, and at the same time, it does not need to occupy too much space.

SUMMARY OF THE INVENTION

It is one object of the present disclosure to provide a capacitor structure having vertically-arranged diffusion plates in a silicon substrate, which is capable of solving the above-mentioned prior art shortcomings and deficiencies.

One aspect of the present disclosure provides a capacitor structure including a semiconductor substrate, a first vertical diffusion plate disposed in the semiconductor substrate, a first shallow trench isolation (STI) structure disposed in the semiconductor substrate and surrounding the first vertical diffusion plate, and a second vertical diffusion plate disposed in the semiconductor substrate and surrounding the first STI structure. The first vertical diffusion plate further comprises a first lower portion that is part of the semiconductor substrate. The first lower portion is surrounded and electrically isolated by a first wafer-backside trench isolation structure.

According to some embodiments, the first wafer-backside trench isolation structure is in direct contact with a bottom of the first STI structure.

According to some embodiments, the first wafer-backside trench isolation structure has a lateral thickness t that is smaller than that of the first STI structure.

According to some embodiments, the first wafer-backside trench isolation structure has approximately the same ring shape as that of the first STI structure.

According to some embodiments, the first vertical diffusion plate is a P-type doped or N-type doped region.

According to some embodiments, the second vertical diffusion plate is a P-type doped or N-type doped region.

According to some embodiments, the capacitor structure further comprises an insulating layer disposed on a backside of the semiconductor substrate.

According to some embodiments, the first STI structure and the first wafer-backside trench isolation structure isolate the first vertical diffusion plate from the second vertical diffusion plate.

According to some embodiments, the first vertical diffusion plate is electrically coupled to a first voltage and the second vertical diffusion plate is electrically coupled to a second voltage, wherein the second voltage is higher than the first voltage.

According to some embodiments, a capacitor is formed between the first vertical diffusion plate and the second vertical diffusion plate with the first STI structure and the first wafer-backside trench isolation structure interposed therebetween acting as a capacitor dielectric layer.

According to some embodiments, the capacitor structure further comprises a first heavily doped region disposed at a surface of the first vertical diffusion plate, and a second heavily doped region disposed at a surface of the second vertical diffusion plate.

According to some embodiments, the capacitor structure further comprises a second shallow trench isolation (STI) structure disposed in the semiconductor substrate. The second STI structure surrounds the second vertical diffusion plate, the first STI structure, and the first vertical diffusion plate.

According to some embodiments, the second vertical diffusion plate further comprises a second lower portion that is part of the semiconductor substrate.

According to some embodiments, the second lower portion is surrounded and electrically isolated by a second wafer-backside trench isolation structure and the first wafer-backside trench isolation structure.

According to some embodiments, the second STI structure, the second vertical diffusion plate, the first STI structure are arranged concentrically with the first vertical diffusion plate.

According to some embodiments, the first vertical diffusion plate and the second vertical diffusion plate are silicon active areas defined and isolated by the first STI structure and the second STI structure.

According to some embodiments, the capacitor structure further comprises a passive element directly on a top surface of the first STI structure or the second STI structure.

According to some embodiments, the passive element comprises a resistor. According to some embodiments, the passive element comprises polysilicon.

According to some embodiments, the capacitor structure further comprises a third vertical diffusion plate surrounding the second STI structure, the second vertical diffusion plate, the first STI structure, and the first vertical diffusion plate, and a third shallow trench isolation (STI) structure surrounding the third vertical diffusion plate, the second STI structure, the second vertical diffusion plate, the first STI structure, and the first vertical diffusion plate.

According to some embodiments, the capacitor structure further comprises a fourth vertical diffusion plate surrounding the third STI structure, the third vertical diffusion plate, the second STI structure, the second vertical diffusion plate, the first STI structure, and the first vertical diffusion plate, and a fourth shallow trench isolation (STI) structure surrounding the fourth vertical diffusion plate, the third STI structure, the third vertical diffusion plate, the second STI structure, the second vertical diffusion plate, the first STI structure, and the first vertical diffusion plate.

According to some embodiments, the second vertical diffusion plate, the fourth vertical diffusion plate and the ion well are electrically coupled to an anode node, and the first vertical diffusion plate and the third vertical diffusion plate are electrically coupled to a cathode node.

According to some embodiments, the semiconductor substrate is a silicon substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
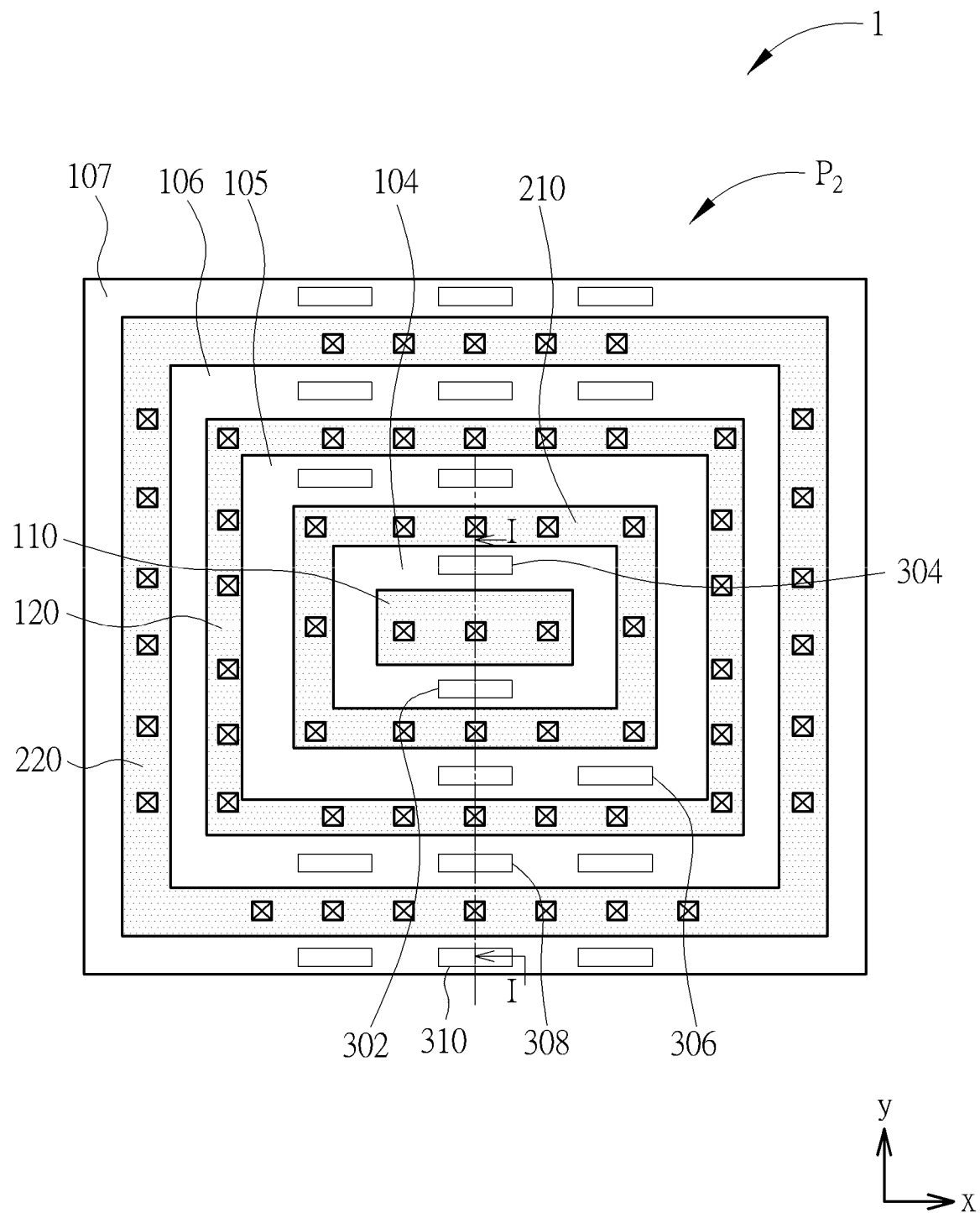
FIG. 1 is a schematic diagram showing an exemplary layout structure of a capacitor structure fabricated in a semiconductor substrate according to one embodiment of the invention.

Embodiments of the present disclosure will be described with reference to the accompanying drawings.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment.

Further, when a particular feature, structure or characteristic is described in contact with an embodiment, it would be within the knowledge of a person skilled in the pertinent art to affect such feature, structure or characteristic in contact with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The present disclosure pertains to a capacitor structure having vertically-arranged diffusion plates in a silicon substrate. The aforesaid capacitor structure may be fabricated on a CMOS wafer, which may be bonded to an array wafer to form a three-dimensional (3D) NAND device. Shallow trench isolation (STI) structures, which function as capacitor dielectric layers, are disposed between the vertically-arranged diffusion plates of the capacitor structure. At the bottom and along the perimeter of the capacitor structure, wafer backside trench isolation is provided to electrically isolate the diffusion plates of opposite polarities from one another. The aforesaid capacitor structure may be integrated in a polysilicon gate (poly-gate) capacitor/resistor area so that the space of the CMOS wafer may be efficiently used and the capacitance per unit area may be increased.

Figure 2:
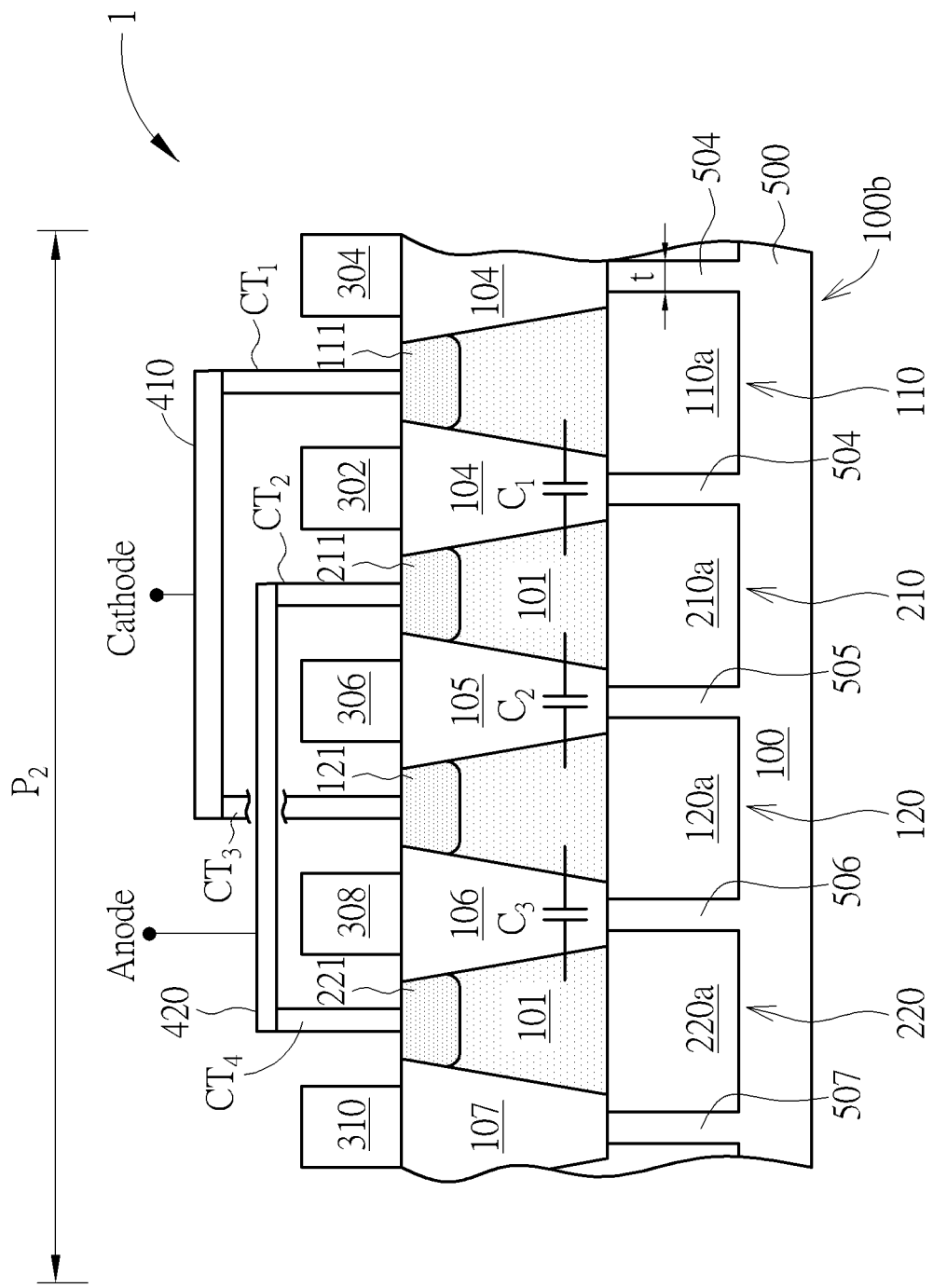
FIG. 2 is a schematic, cross-sectional view taken along line I-I' in FIG. 1.

Please refer to FIG. 1 and FIG. 2. FIG. 1 is a schematic diagram showing an exemplary layout structure of a capacitor structure fabricated in a semiconductor substrate according to one embodiment of the invention. FIG. 2 is a schematic, cross-sectional view taken along line I-I' in FIG. 1. It is to be understood that the shapes of the elements or layouts of the capacitor structure depicted through the figures are for illustration purposes only. Different shapes or layouts may be employed according to various embodiments of the present disclosure.

As shown in FIG. 1 and FIG. 2, a capacitor structure 1 may be constructed within a poly-gate capacitor/resistor area (P2 area) in a semiconductor substrate 100 of a semiconductor material such as silicon, but is not limited thereto. According to one embodiment of the present disclosure, for example, the semiconductor substrate 100 may be a P type silicon substrate. However, it is to be understood that other semiconductor substrates such as silicon-on-insulator (SOI) substrates or epitaxial substrates may be employed according to other embodiments. According to one embodiment of the present disclosure, the semiconductor substrate 100 has a frontside 100a and a backside 100b.

On the semiconductor substrate 100, a plurality of CMOS circuit elements (not shown) may be fabricated so as to form a CMOS wafer. The CMOS wafer may be bonded to an array wafer (or memory cell wafer) to form a three-dimensional (3D) NAND device. The capacitor structure 1 of the present disclosure can provide high capacitance that is required to implement voltage boosting during the operation of the 3D NAND device. Further, the capacitor structure 1 of the present disclosure is compatible with current CMOS processes. The capacitor structure 1 of the present disclosure is an integrated capacitor structure that is integrally fabricated with the CMOS circuit elements.

In the non-limiting embodiment illustrated in FIG. 1 and FIG. 2, the capacitor structure 1 comprises a first vertical diffusion plate 110 surrounded by a first shallow trench isolation (STI) structure 104. When viewed from the above, as can be seen in FIG. 1, the first vertical diffusion plate 110 may have a rectangular shape with its longer axis or longer side extending along the reference x-axis and its shorter side extending along the reference y-axis. The first STI structure 104 is a ring-shaped trench isolation that is formed on the frontside 100a of the semiconductor substrate 100. The first STI structure 104 electrically isolates the first vertical diffusion plate 110. It is understood that different shapes or layouts of the first vertical diffusion plate 110 and the first STI structure 104 may be employed according to various embodiments of the present disclosure.

According to one embodiment of the present disclosure, the first vertical diffusion plate 110 is a silicon active area defined and isolated by the first STI structure 104. According to one embodiment of the present disclosure, the first vertical diffusion plate 110 may be a P-type doped or N-type doped silicon area. For example, by performing ion well implantation processes using suitable hard mask, which are commonly performed to form ion wells in the CMOS logic circuit regions, P-type dopants such boron or N-type dopants such as phosphorus may be implanted into the silicon active area defined and isolated by the first STI structure 104, thereby forming the first vertical diffusion plate 110. A heavily doped region 111 such as a $P^+$ region or an $N^+$ region may be formed at the surface of the first vertical diffusion plate 110. Therefore, the doping concentration of the first vertical diffusion plate 110 after the ion well implantation processes is higher than that of the semiconductor substrate 100.

According to one embodiment of the present disclosure, for example, the first STI structure 104 may be formed by performing the following steps including but not limited to: (1) etching an annular isolation trench into the semiconductor substrate 100; (2) forming a liner layer such as a silicon oxide or silicon nitride liner on the interior surface of the annular isolation trench; (3) filling the annular isolation trench with a trench-fill insulating layer such as silicon dioxide or HDPCVD oxide; and (4) performing a chemical mechanical polishing (CMP) to remove excess trench-fill insulating layer outside the annular isolation trench.

According to one embodiment of the present disclosure, the first vertical diffusion plate 110 further comprises a lower portion 110a that is part of the semiconductor substrate 100. As can be seen in FIG. 2, the lower portion 110a may be wider than the overlying portion of the first vertical diffusion plate 110 surrounded by the first STI structure 104. According to one embodiment of the present disclosure, the lower portion 110a is surrounded and electrically isolated by a wafer-backside trench isolation structure 504. According to one embodiment of the present disclosure, the wafer-backside trench isolation structure 504 has approximately the same ring shape as that of the first STI structure 104. According to one embodiment of the present disclosure, the wafer-backside trench isolation structure 504 is in direct contact with a bottom of the first STI structure 104. According to one embodiment of the present disclosure, the wafer-backside trench isolation structure 504 has a lateral thickness t that is smaller than that of the first STI structure 104.

According to one embodiment of the present disclosure, an insulating layer 500 is disposed on the backside 100b of the semiconductor substrate 100. According to one embodiment of the present disclosure, the wafer-backside trench isolation structure 504 is formed by filling wafer backside trenches with the insulating layer 500. According to one embodiment of the present disclosure, the insulating layer 500 may be formed by chemical vapor deposition (CVD) methods including, but not limited to, plasma-enhanced CVD (PECVD), low-pressure CVD (LPCVD), rapid-thermal CVD (RTCVD), or atomic-layer deposition (ALD)

methods. For example, the insulating layer 500 may comprises silicon oxide, silicon nitride, silicon oxynitride, but is not limited thereto.

The capacitor structure 1 further comprises a second vertical diffusion plate 210 surrounding the first STI structure 104 and the first vertical diffusion plate 110. When viewed from the above, as can be seen in FIG. 1, the second vertical diffusion plate 210 is an annular-shaped structure that encircles the annular first STI structure 104. The second vertical diffusion plate 210 is defined and isolated by the first STI structure 104 and an outer second STI structure 105. The second STI structure 105 is also a ring-shaped trench isolation that electrically isolates the second vertical diffusion plate 210. The second STI structure 105 may be formed by the STI process steps as previously described.

According to one embodiment of the present disclosure, the second vertical diffusion plate 210 is a silicon active area defined and isolated by the first STI structure 104 and the second STI structure 105. According to one embodiment of the present disclosure, likewise, the second vertical diffusion plate 210 may be a P-type doped or N-type doped silicon area. For example, by performing ion well implantation processes using suitable hard mask, which are commonly performed to form ion wells in the CMOS logic circuit regions, P-type dopants such boron or N-type dopants such as phosphorus may be implanted into the silicon active area defined and isolated by the first STI structure 104 and the second STI structure 105, thereby forming the first vertical diffusion plate 110 and the second vertical diffusion plate 210. A heavily doped region 211 such as a $P^+$ region or an $N^+$ region may be formed at the surface of the second vertical diffusion plate 210.

According to one embodiment of the present disclosure, the second vertical diffusion plate 210 further comprises a lower portion 210a that is part of the semiconductor substrate 100. As can be seen in FIG. 2, the lower portion 210a may be wider than the overlying portion of the second vertical diffusion plate 210 surrounded by the second STI structure 105. According to one embodiment of the present disclosure, the lower portion 210a is surrounded and electrically isolated by an outer wafer-backside trench isolation structure 505 and the inner wafer-backside trench isolation structure 504. According to one embodiment of the present disclosure, the wafer-backside trench isolation structure 505 has approximately the same ring shape as that of the second STI structure 105. According to one embodiment of the present disclosure, the wafer-backside trench isolation structure 505 is in direct contact with a bottom of the second STI structure 105.

According to one embodiment of the present disclosure, the wafer-backside trench isolation structure 505 is formed by filling wafer backside trenches with the insulating layer 500. According to one embodiment of the present disclosure, the insulating layer 500 may be formed by chemical vapor deposition (CVD) methods including, but not limited to, plasma-enhanced CVD (PECVD), low-pressure CVD (LPCVD), rapid-thermal CVD (RTCVD), or atomic-layer deposition (ALD) methods. For example, the insulating layer 500 may comprises silicon oxide, silicon nitride, silicon oxynitride, but is not limited thereto.

According to one embodiment of the present disclosure, as can be seen in FIG. 2, a capacitor $C_1$ (Si-to-Si capacitor) may be formed between the first vertical diffusion plate 110 and the second vertical diffusion plate 210 with the annular first STI structure 104 and the wafer-backside trench isolation structure 504 interposed therebetween acting as a capacitor dielectric layer. A plurality of first contact elements $CT_1$ may be disposed on the first vertical diffusion plate 110. Through the plurality of first contact elements $CT_1$ and the metal interconnect 410, the first vertical diffusion plate 110 may be electrically coupled to a cathode node of the capacitor structure 1, which is provided with a first voltage. A plurality of second contact elements $CT_2$ may be disposed on the second vertical diffusion plate 210. Through the plurality of second contact elements $CT_2$ and the metal interconnect 420, the second vertical diffusion plate 210 may be electrically coupled to an anode node of the capacitor structure 1, which is provided with a second voltage. According to one embodiment of the present disclosure, the second voltage may be higher than the first voltage.

According to one embodiment of the present disclosure, passive elements 302 and 304 such as resistors or the like may be formed on the top surface of the first STI structure 104 and passive elements 306 such as resistors or the like may be formed on the top surface of the second STI structure 105. According to one embodiment of the present disclosure, the passive elements 302, 304, and 306 may be composed of polysilicon, but is not limited thereto. According to one embodiment of the present disclosure, the passive elements 302, 304, and 306 are only formed on the first STI structure 104 and the second STI structure 105, respectively. It is understood that the layout and number of the passive elements 302, 304, and 306 illustrated in FIG. 1 is for illustration purposes only.

According to one embodiment of the present disclosure, the capacitor structure 1 may further comprises a third vertical diffusion plate 120 surrounding the second STI structure 105, the second vertical diffusion plate 210, the first STI structure 104, and the first vertical diffusion plate 110. When viewed from the above, as can be seen in FIG. 1, the third vertical diffusion plate 120 is an annular-shaped structure that encircles the annular second STI structure 105. The third vertical diffusion plate 120 is defined and isolated by the second STI structure 105 and an outer third STI structure 106. The third STI structure 106 is also a ring-shaped trench isolation that electrically isolates the third vertical diffusion plate 120. The third STI structure 106 may be formed by the STI process steps as previously described. According to one embodiment of the present disclosure, the third STI structure 106, the third vertical diffusion plate 120, the second STI structure 105, the second vertical diffusion plate 210, and the first STI structure 104 are arranged concentrically with the innermost first vertical diffusion plate 110.

According to one embodiment of the present disclosure, the third vertical diffusion plate 120 is a silicon active area defined and isolated by the second STI structure 105 and the third STI structure 106. According to one embodiment of the present disclosure, likewise, the third vertical diffusion plate 120 may be a P-type doped or N-type doped silicon area. For example, by performing ion well implantation processes using suitable hard mask, which are commonly performed to form ion wells in the CMOS logic circuit regions, P-type dopants such boron or N-type dopants such as phosphorus may be implanted into the silicon active area defined and isolated by the second STI structure 105 and the third STI structure 106, thereby forming the first vertical diffusion plate 110, the second vertical diffusion plate 210, and the third vertical diffusion plate 120. A heavily doped region 121 such as a $P^+$ region or an $N^+$ region may be formed at the surface of the third vertical diffusion plate 120.

According to one embodiment of the present disclosure, the third vertical diffusion plate 120 further comprises a lower portion 120a that is part of the semiconductor substrate 100. As can be seen in FIG. 2, the lower portion 120a may be wider than the overlying portion of the second vertical diffusion plate 120 surrounded by the third STI structure 106. According to one embodiment of the present disclosure, the lower portion 120a is surrounded and electrically isolated by an outer wafer-backside trench isolation structure 506 and the inner wafer-backside trench isolation structure 505. According to one embodiment of the present disclosure, the wafer-backside trench isolation structure 506 has approximately the same ring shape as that of the third STI structure 106. According to one embodiment of the present disclosure, the wafer-backside trench isolation structure 506 is in direct contact with a bottom of the third STI structure 106.

According to one embodiment of the present disclosure, the wafer-backside trench isolation structure 506 is formed by filling wafer backside trenches with the insulating layer 500. According to one embodiment of the present disclosure, the insulating layer 500 may be formed by chemical vapor deposition (CVD) methods including, but not limited to, plasma-enhanced CVD (PECVD), low-pressure CVD (LP-CVD), rapid-thermal CVD (RTCVD), or atomic-layer deposition (ALD) methods. For example, the insulating layer 500 may comprises silicon oxide, silicon nitride, silicon oxynitride, but is not limited thereto.

According to one embodiment of the present disclosure, as can be seen in FIG. 2, a capacitor $C_2$ (Si-to-Si capacitor) may be formed between the second vertical diffusion plate 210 and the third vertical diffusion plate 120 with the annular second STI structure 105 and the wafer-backside trench isolation structure 505 interposed therebetween acting as a capacitor dielectric layer. A plurality of third contact elements $CT_3$ may be disposed on the third vertical diffusion plate 120. Through the plurality of third contact elements $CT_3$ and the metal interconnect 410, the third vertical diffusion plate 120 may be electrically coupled to the cathode node of the capacitor structure 1, which is provided with the first voltage. Therefore, according to one embodiment of the present disclosure, as can be seen in FIG. 2, the first vertical diffusion plate 110 and the third vertical diffusion plate 120 are both electrically coupled to the cathode node.

According to one embodiment of the present disclosure, passive elements 308 such as resistors or the like may be formed on the top surface of the third STI structure 106. According to one embodiment of the present disclosure, the passive elements 308 may be composed of polysilicon, but is not limited thereto. According to one embodiment of the present disclosure, the passive elements 308 are only formed on the third STI structure 106. It is understood that the layout and number of the passive elements 308 illustrated in FIG. 1 is for illustration purposes only.

According to one embodiment of the present disclosure, the capacitor structure 1 may further comprises a fourth vertical diffusion plate 220 surrounding the third STI structure 106, the third vertical diffusion plate 120, the second STI structure 105, the second vertical diffusion plate 210, the first STI structure 104, and the first vertical diffusion plate 110. When viewed from the above, as can be seen in FIG. 1, the fourth vertical diffusion plate 220 is an annular-shaped structure that encircles the annular third STI structure 106. The fourth vertical diffusion plate 220 is defined and isolated by the third STI structure 106 and a fourth STI structure 107. The fourth STI structure 107 is also a ring-shaped trench isolation that electrically isolates the fourth vertical diffusion plate 220. The fourth STI structure 107 may be formed by the STI process steps as previously described. According to one embodiment of the present disclosure, the fourth STI structure 107, the fourth vertical diffusion plate 220, the third STI structure 106, the third vertical diffusion plate 120, the second STI structure 105, the second vertical diffusion plate 210, and the first STI structure 104 are arranged concentrically with the innermost first vertical diffusion plate 110.

According to one embodiment of the present disclosure, the fourth vertical diffusion plate 220 is a silicon active area defined and isolated by the third STI structure 106 and the fourth STI structure 107. According to one embodiment of the present disclosure, likewise, the fourth vertical diffusion plate 220 may be a P-type doped or N-type doped silicon area. For example, by performing ion well implantation processes using suitable hard mask, which are commonly performed to form ion wells in the CMOS logic circuit regions, P-type dopants such boron or N-type dopants such as phosphorus may be implanted into the silicon active area defined and isolated by the third STI structure 106 and the fourth STI structure 107, thereby forming the first vertical diffusion plate 110, the second vertical diffusion plate 210, the third vertical diffusion plate 120, and the fourth vertical diffusion plate 220. A heavily doped region 221 such as a $P^+$ region or an $N^+$ region may be formed at the surface of the fourth vertical diffusion plate 220.

According to one embodiment of the present disclosure, the fourth vertical diffusion plate 220 further comprises a lower portion 220a that is part of the semiconductor substrate 100. As can be seen in FIG. 2, the lower portion 220a may be wider than the overlying portion of the fourth vertical diffusion plate 220 surrounded by the fourth STI structure 107. According to one embodiment of the present disclosure, the lower portion 220a is surrounded and electrically isolated by an outer wafer-backside trench isolation structure 507 and the inner wafer-backside trench isolation structure 506. According to one embodiment of the present disclosure, the wafer-backside trench isolation structure 507 has approximately the same ring shape as that of the fourth STI structure 107. According to one embodiment of the present disclosure, the wafer-backside trench isolation structure 507 is in direct contact with a bottom of the fourth STI structure 107.

According to one embodiment of the present disclosure, the wafer-backside trench isolation structure 507 is formed by filling wafer backside trenches with the insulating layer 500. According to one embodiment of the present disclosure, the insulating layer 500 may be formed by chemical vapor deposition (CVD) methods including, but not limited to, plasma-enhanced CVD (PECVD), low-pressure CVD (LP-CVD), rapid-thermal CVD (RTCVD), or atomic-layer deposition (ALD) methods. For example, the insulating layer 500 may comprises silicon oxide, silicon nitride, silicon oxynitride, but is not limited thereto.

According to one embodiment of the present disclosure, as can be seen in FIG. 2, a capacitor $C_3$ (Si-to-Si capacitor) may be formed between the third vertical diffusion plate 120 and the fourth vertical diffusion plate 220 with the annular third STI structure 106 and the wafer-backside trench isolation structure 506 interposed therebetween acting as a capacitor dielectric layer. A plurality of fourth contact elements $CT_4$ may be disposed on the fourth vertical diffusion plate 220. Through the plurality of fourth contact elements $CT_4$ and the metal interconnect 420, the fourth vertical diffusion plate 220 may be electrically coupled to the anode node of the capacitor structure 1, which is provided with the second voltage. Therefore, according to one embodiment of the present disclosure, as can be seen in FIG. 2, the second vertical diffusion plate 210 and the fourth vertical diffusion plate 220 are both electrically coupled to the anode node.

According to one embodiment of the present disclosure, passive elements 310 such as resistors or the like may be formed on the top surface of the fourth STI structure 107. According to one embodiment of the present disclosure, the passive elements 310 may be composed of polysilicon, but is not limited thereto. According to one embodiment of the present disclosure, the passive elements 310 are only formed on the fourth STI structure 107. It is understood that the layout and number of the passive elements 310 illustrated in FIG. 1 is for illustration purposes only.

Structurally, the capacitor structure 1 includes a semiconductor substrate 100, a first vertical diffusion plate 110 disposed in the semiconductor substrate 100, a first shallow trench isolation (STI) structure 104 disposed in the semiconductor substrate 100 and surrounding the first vertical diffusion plate 110, and a second vertical diffusion plate 210 disposed in the semiconductor substrate 100 and surrounding the first STI structure 104. The first vertical diffusion plate 110 further comprises a first lower portion 110a that is part of the semiconductor substrate 100. The first lower portion 110a is surrounded and electrically isolated by a first wafer-backside trench isolation structure 504.

According to some embodiments, the first wafer-backside trench isolation structure 504 is in direct contact with a bottom of the first STI structure 104.

According to some embodiments, the first wafer-backside trench isolation structure 504 has a lateral thickness t that is smaller than that of the first STI structure 104.

According to some embodiments, the first wafer-backside trench isolation structure 504 has approximately the same ring shape as that of the first STI structure 104.

According to some embodiments, the first vertical diffusion plate 110 is a P-type doped or N-type doped region.

According to some embodiments, the second vertical diffusion plate 210 is a P-type doped or N-type doped region.

According to some embodiments, the capacitor structure 1 further comprises an insulating layer 500 disposed on a backside 100b of the semiconductor substrate 100.

According to some embodiments, the first STI structure 104 and the first wafer-backside trench isolation structure 504 isolate the first vertical diffusion plate 110 from the second vertical diffusion plate 210.

According to some embodiments, the first vertical diffusion plate 110 is electrically coupled to a first voltage and the second vertical diffusion plate 210 is electrically coupled to a second voltage, wherein the second voltage is higher than the first voltage.

According to some embodiments, a capacitor $C_1$ is formed between the first vertical diffusion plate 110 and the second vertical diffusion plate 210 with the first STI structure 104 and the first wafer-backside trench isolation structure 504 interposed therebetween acting as a capacitor dielectric layer.

According to some embodiments, the capacitor structure 1 further comprises a first heavily doped region 111 disposed at a surface of the first vertical diffusion plate 110, and a second heavily doped region 211 disposed at a surface of the second vertical diffusion plate 210.

According to some embodiments, the capacitor structure 1 further comprises a second shallow trench isolation (STI) structure 105 disposed in the semiconductor substrate 100. The second STI structure 105 surrounds the second vertical diffusion plate 210, the first STI structure 104, and the first vertical diffusion plate 110.

According to some embodiments, the second vertical diffusion plate 210 further comprises a second lower portion 210a that is part of the semiconductor substrate 100.

According to some embodiments, the second lower portion 210a is surrounded and electrically isolated by a second wafer-backside trench isolation structure 505 and the first wafer-backside trench isolation structure 504.

According to some embodiments, the second STI structure 105, the second vertical diffusion plate 210, the first STI structure 104 are arranged concentrically with the first vertical diffusion plate 110.

According to some embodiments, the first vertical diffusion plate 110 and the second vertical diffusion plate 210 are silicon active areas defined and isolated by the first STI structure 104 and the second STI structure 105.

According to some embodiments, the capacitor structure 1 further comprises a passive element 302, 306 directly on a top surface of the first STI structure 104 or the second STI structure 105.

According to some embodiments, the passive element 302, 306 comprises a resistor. According to some embodiments, the passive element 302, 306 comprises polysilicon.

According to some embodiments, the capacitor structure 1 further comprises a third vertical diffusion plate 120 surrounding the second STI structure 105, the second vertical diffusion plate 210, the first STI structure 104, and the first vertical diffusion plate 110, and a third shallow trench isolation (STI) structure 106 surrounding the third vertical diffusion plate 120, the second STI structure 105, the second vertical diffusion plate 210, the first STI structure 104, and the first vertical diffusion plate 110.

According to some embodiments, the capacitor structure 1 further comprises a fourth vertical diffusion plate 220 surrounding the third STI structure 106, the third vertical diffusion plate 120, the second STI structure 105, the second vertical diffusion plate 210, the first STI structure 104, and the first vertical diffusion plate 110, and a fourth shallow trench isolation (STI) structure 107 surrounding the fourth vertical diffusion plate 220, the third STI structure 106, the third vertical diffusion plate 120, the second STI structure 105, the second vertical diffusion plate 210, the first STI structure 104, and the first vertical diffusion plate 110.

According to some embodiments, the second vertical diffusion plate 210, the fourth vertical diffusion plate 220 and the ion well 101 are electrically coupled to an anode node, and the first vertical diffusion plate 110 and the third vertical diffusion plate 120 are electrically coupled to a cathode node.

According to some embodiments, the semiconductor substrate 100 is a silicon substrate.

Figure 3:
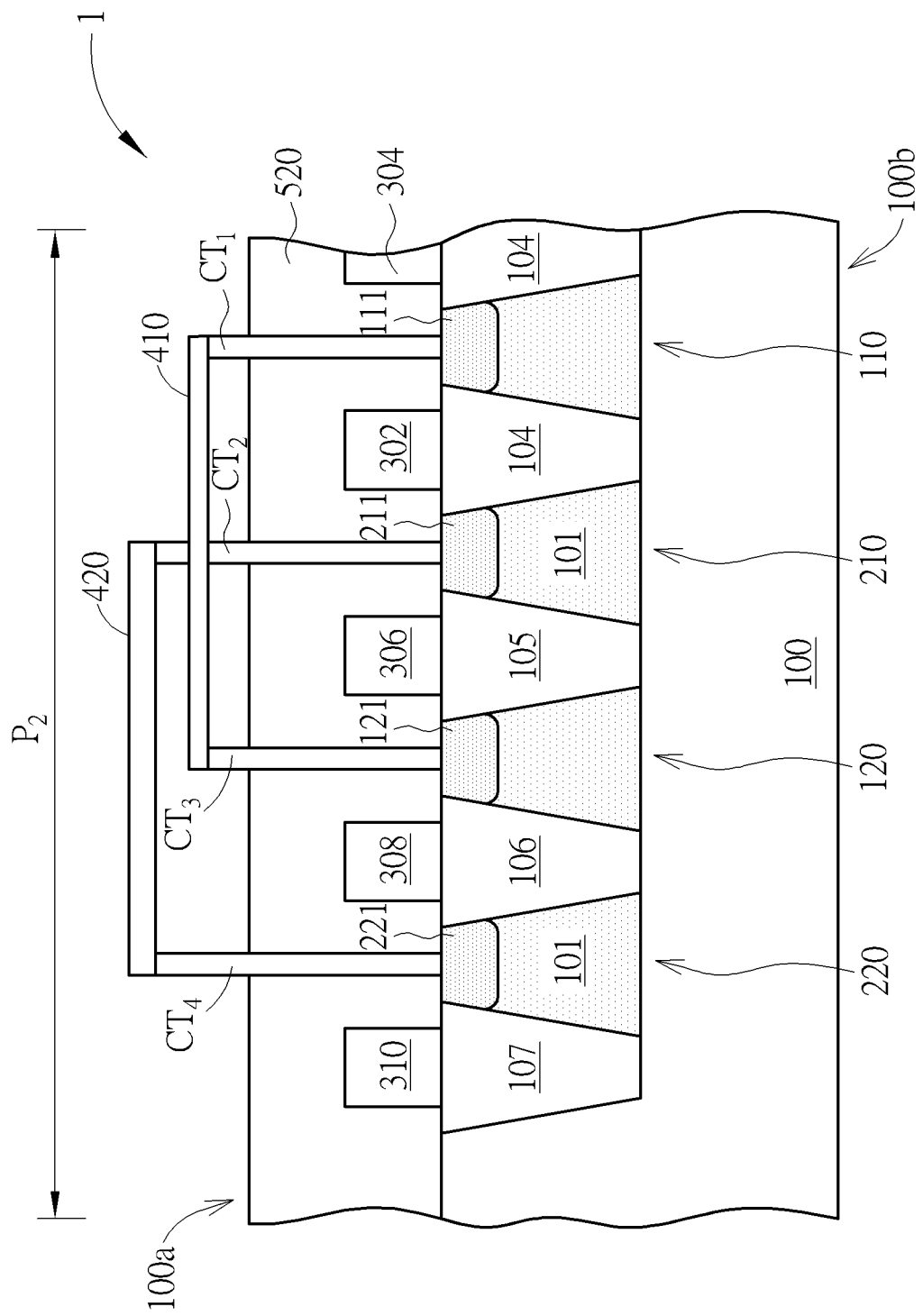
FIG. 3 to FIG. 5 are schematic, cross-sectional diagrams showing an exemplary method for fabricating a capacitor structure according to another embodiment of the present disclosure.
Figure 4:
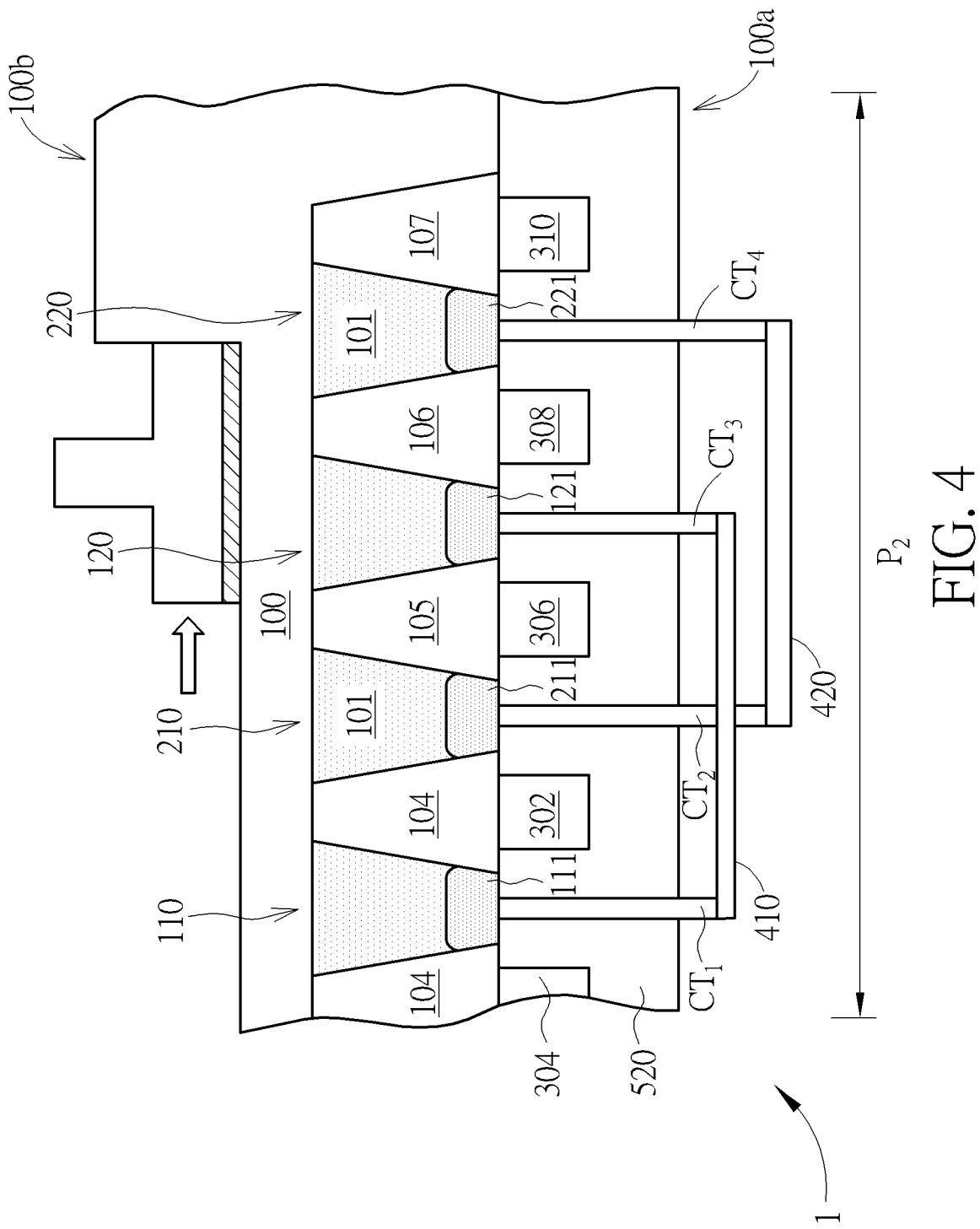
Figure 5:
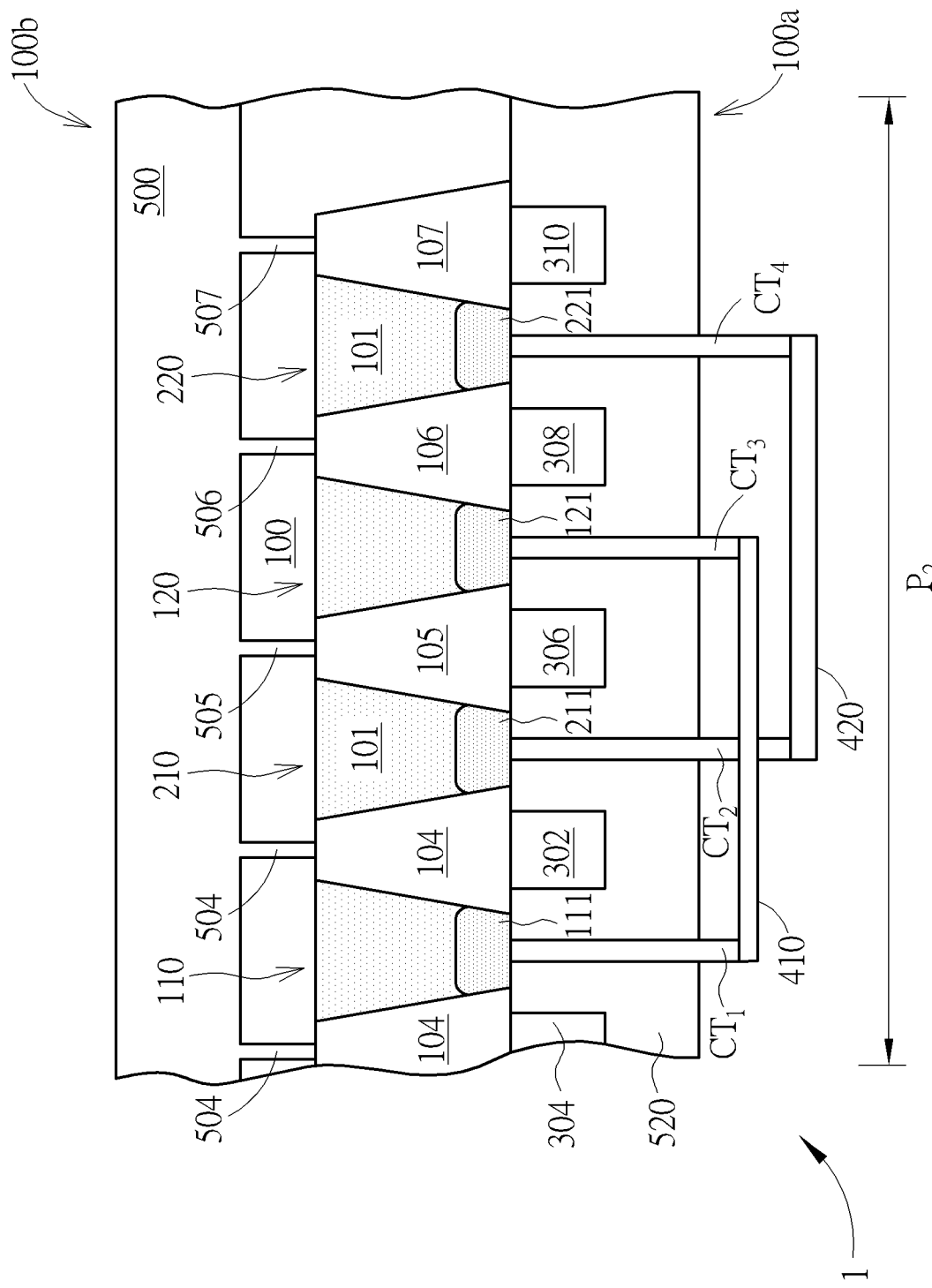

Please refer to FIG. 3 to FIG. 5. FIG. 3 to FIG. 5 are schematic, cross-sectional diagrams showing an exemplary method for fabricating a capacitor structure according to another embodiment of the present disclosure, wherein like regions, layers, or elements are designated by like numeral numbers.

As shown in FIG. 3, the P2 area of the semiconductor substrate 100 such as a P-type silicon substrate is subjected to STI processes as previously described, thereby forming alternate, concentric rings of active areas and alternate, concentric rings of STI structures interposed between the rings of active areas. For example, the innermost first vertical diffusion plate 110 is surrounded by the first STI structure 104, the second vertical diffusion plate 210, the second STI structure 105, the third vertical diffusion plate 120, the third STI structure 106, the fourth vertical diffusion plate 220, and the outermost fourth STI structure 107.

Patterned polysilicon layers are formed on the STI structures. The patterned polysilicon layers may form passive elements such as the passive elements 302-310.

After the formation of the passive elements 302-310, a dielectric layer 520 may be deposited on the frontside 100a of the semiconductor substrate 100. Interconnect structures such as contact plugs, such as the contact plugs CT$_1$-CT$_4$ as previously described, and metal lines/traces, such as interconnect 410 or 420 as previously described, may be formed in or on the dielectric layer 520. For the sake of simplicity, only one dielectric layer 520 is shown. However, it is understood that the dielectric layer 520 may comprise multiple layers of dielectric materials or the like. Through the interconnect structures, the second vertical diffusion plate 210, the fourth vertical diffusion plate 220 and the ion well 101 are electrically coupled to an anode node, and the first vertical diffusion plate 110 and the third vertical diffusion plate 120 are electrically coupled to a cathode node.

The P2 area of the semiconductor substrate 100 may be subjected to several ion implantation processes to form P-type or N-type doped first vertical diffusion plate 110, P-type or N-type doped second vertical diffusion plate 210, P-type or N-type doped third vertical diffusion plate 120, P-type or N-type doped fourth vertical diffusion plate 220, and heavily doped regions 111, 121, 211, 221.

As shown in FIG. 4, subsequently, the semiconductor substrate 100 may be flipped and the backside 100b is then subjected to a wafer thinning process to remove a portion of the semiconductor substrate 100 from the backside 100b. The wafer backside thinning process is well known in the art, and is not described in further details here. For example, the frontside 100a of the semiconductor substrate 100 may be adhered to a carrier substrate (not shown) and then the backside 100b is polished or ground by wafer polishing methods known in the art.

As shown in FIG. 5, the wafer-backside trench isolation structures 504-507 are formed on the backside 100b of the semiconductor substrate 100 by using techniques such as through substrate contact (TSC) processes. For example, first, concentric, annular-shaped trenches are formed in the semiconductor substrate 100 by lithography and etching processes. Subsequently, the insulating layer 500 is deposited on the backside 100b of the semiconductor substrate 100 and the concentric, annular-shaped trenches are filled with the insulating layer 500.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitor structure, comprising:
   a semiconductor substrate;
   a first vertical diffusion plate disposed in the semiconductor substrate, wherein the first vertical diffusion plate further comprises a first lower portion that is part of the semiconductor substrate, and wherein the first lower portion is surrounded and electrically isolated by a first wafer-backside trench isolation structure;
   a first shallow trench isolation (STI) structure disposed in the semiconductor substrate and the first STI structure surrounding the first vertical diffusion plate; and
   a second vertical diffusion plate of the first conductivity type disposed in the semiconductor substrate and the second vertical diffusion plate surrounding the first STI structure.

2. The capacitor structure according to claim 1, wherein the first wafer-backside trench isolation structure is in direct contact with a bottom of the first STI structure.

3. The capacitor structure according to claim 1, wherein the first wafer-backside trench isolation structure has a lateral thickness that is smaller than that of the first STI structure.

4. The capacitor structure according to claim 1, wherein the first wafer-backside trench isolation structure has a same ring shape as that of the first STI structure.

5. The capacitor structure according to claim 1, wherein the first vertical diffusion plate is a P-type doped or N-type doped region.

6. The capacitor structure according to claim 5, wherein the second vertical diffusion plate is a P-type doped or N-type doped region.

7. The capacitor structure according to claim 1 further comprising:
   an insulating layer disposed on a backside of the semiconductor substrate.

8. The capacitor structure according to claim 1, wherein the first STI structure and the first wafer-backside trench isolation structure isolate the first vertical diffusion plate from the second vertical diffusion plate.

9. The capacitor structure according to claim 1, wherein the first vertical diffusion plate is electrically coupled to a first voltage and the second vertical diffusion plate is electrically coupled to a second voltage, wherein the second voltage is higher than the first voltage.

10. The capacitor structure according to claim 1, wherein a capacitor is formed between the first vertical diffusion plate and the second vertical diffusion plate with the first STI structure and the first wafer-backside trench isolation structure interposed therebetween acting as a capacitor dielectric layer.

11. The capacitor structure according to claim 1 further comprising:
    a first heavily doped region disposed at a surface of the first vertical diffusion plate; and
    a second heavily doped region disposed at a surface of the second vertical diffusion plate.

12. The capacitor structure according to claim 1 further comprising:
    a second shallow trench isolation (STI) structure disposed in the semiconductor substrate and the second STI structure surrounding the second vertical diffusion plate, the first STI structure, and the first vertical diffusion plate.

13. The capacitor structure according to claim 12, wherein the second vertical diffusion plate further comprises a second lower portion that is part of the semiconductor substrate.

14. The capacitor structure according to claim 13, wherein the second lower portion is surrounded and electrically isolated by a second wafer-backside trench isolation structure and the first wafer-backside trench isolation structure.

15. The capacitor structure according to claim 12, wherein the second STI structure, the second vertical diffusion plate, the first STI structure are arranged concentrically with the first vertical diffusion plate.

16. The capacitor structure according to claim 12, wherein the first vertical diffusion plate and the second vertical diffusion plate are silicon active areas defined and isolated by the first STI structure and the second STI structure.

17. The capacitor structure according to claim 12 further comprising:
    a passive element directly on a top surface of the first STI structure or the second STI structure.

18. The capacitor structure according to claim 17, wherein the passive element comprises a resistor.

19. The capacitor structure according to claim 17, wherein the passive element comprises polysilicon.

20. The capacitor structure according to claim 12 further comprising:
a third vertical diffusion plate surrounding the second STI structure, the second vertical diffusion plate, the first STI structure, and the first vertical diffusion plate; and
a third shallow trench isolation (STI) structure surrounding the third vertical diffusion plate, the second STI structure, the second vertical diffusion plate, the first STI structure, and the first vertical diffusion plate.

21. The capacitor structure according to claim 20 further comprising:
a fourth vertical diffusion plate surrounding the third STI structure, the third vertical diffusion plate, the second STI structure, the second vertical diffusion plate, the first STI structure, and the first vertical diffusion plate; and
a fourth shallow trench isolation (STI) structure surrounding the fourth vertical diffusion plate, the third STI structure, the third vertical diffusion plate, the second STI structure, the second vertical diffusion plate, the first STI structure, and the first vertical diffusion plate.

22. The capacitor structure according to claim 21, wherein the second vertical diffusion plate, the fourth vertical diffusion plate and the ion well are electrically coupled to an anode node, and wherein the first vertical diffusion plate and the third vertical diffusion plate are electrically coupled to a cathode node.

23. The capacitor structure according to claim 1, wherein the semiconductor substrate is a silicon substrate.

* * * * *